United States Patent [19]
Gerner

[11] Patent Number: 6,008,669
[45] Date of Patent: Dec. 28, 1999

[54] MONOLITHIC INTEGRATED MULTIPLE MODE CIRCUIT

[75] Inventor: Wolfgang Gerner, Poing, Germany

[73] Assignee: STMicroelectronics GmbH, Grasbrunn, Germany

[21] Appl. No.: 08/879,835

[22] Filed: Jun. 19, 1997

[30] Foreign Application Priority Data

Jun. 19, 1996 [DE] Germany ............................ 196 24 474

[51] Int. Cl.⁶ .................... H03K 19/0175; H03K 19/00
[52] U.S. Cl. ........................ 326/87; 326/58; 327/108
[58] Field of Search ........................ 326/83, 87, 58; 327/108, 109

[56] References Cited

U.S. PATENT DOCUMENTS

| | | | |
|---|---|---|---|
| 3,949,242 | 4/1976 | Hirasawa et al. | 326/60 |
| 4,983,860 | 1/1991 | Yim et al. | 326/83 |
| 5,444,397 | 8/1995 | Wong et al. | 326/81 |
| 5,721,508 | 2/1998 | Rees | 327/382 |
| 5,729,157 | 3/1998 | Monk et al. | 326/80 |
| 5,731,714 | 3/1998 | Monk et al. | 326/83 |
| 5,748,001 | 5/1998 | Cabot | 324/624 |
| 5,764,077 | 6/1998 | Andresen et al. | 326/34 |
| 5,808,481 | 9/1998 | Thompson | 326/83 |

FOREIGN PATENT DOCUMENTS 0202074  11/1986  European Pat. Off. .

OTHER PUBLICATIONS

"Automatic Switching of Substrate Bias or Well Bias in CMOS–ICs", *Electronics Letters*, 26(17):1381–1382, 1990.

*Primary Examiner*—Michael Tokar
*Assistant Examiner*—Richard Roseen
*Attorney, Agent, or Firm*—David V. Carlson; Seed and Berry LLP

[57] ABSTRACT

A monolithic integrated multiple mode circuit having an output stage, a transfer gate, a control circuit arrangement, and a well contacting region where a well potential may be applied, the multiple mode circuit adapted to be controlled into an output stage mode or an input stage mode by means of control data.

14 Claims, 4 Drawing Sheets

MONOLITHIC INTEGRATED MULTIPLE MODE CIRCUIT

TECHNICAL FIELD

The invention relates to a monolithic integrated multiple mode circuit comprising, in a substrate or an epitaxial layer of a semiconductor wafer, a well region in which are formed the drain region and the source region of a MOS transistor as well as a well contacting region.

BACKGROUND OF THE INVENTION

MOS transistors formed in a well region are used mainly in integrated semiconductor circuits having both N-channel MOS transistors and P-channel MOS transistors. Due to the fact that the substrate or epitaxial layer, respectively, usually is of a uniform conductivity type, it is not possible to form therein both the drain and source regions of an N-channel MOS transistor and the source and drain regions of a P-channel MOS transistor. This is why the substrate or epitaxial layer of a first conductivity type is formed with a well region of opposite conductivity type, in which one of the two MOS transistor types is formed, whereas the other MOS transistor type is formed in the substrate or epitaxial layer, respectively.

There are also integrated semiconductor circuits having, in a substrate or an epitaxial layer of very low conductivity of a specific conductivity type, both a well region of the same conductivity type and a well region of the opposite conductivity type. One well region serves to receive the one MOS transistor type, and the other well serves to receive the opposite MOS transistor type. The two well regions are so to speak isolated by the region of the substrate or epitaxial layer, respectively, of very low conductivity that is located therebetween.

For reasons of simplicity, the following description speaks only of a substrate, with this term at all times comprising the possibility that this may also be an epitaxial layer.

Figure 1:
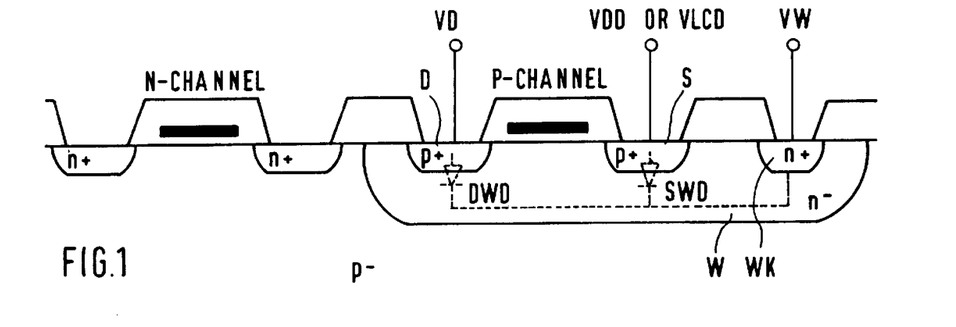
FIG. 1 shows a first embodiment of a monolithic integrated semiconductor circuit involving a voltage mode that avoids problems with parasitic diodes.
Figure 2:
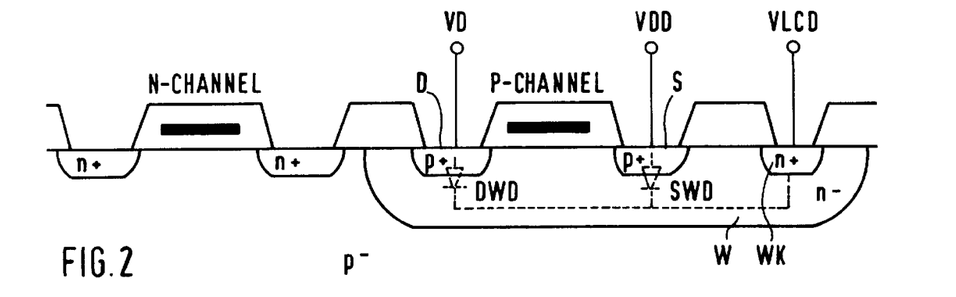
FIG. 2 shows a first alternative of an operation of such a semiconductor circuit in which problems with parasitic diodes may arise;.
Figure 3:
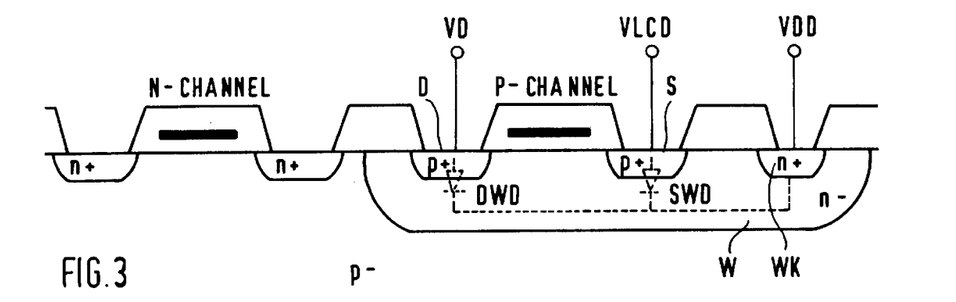
FIG. 3 shows a second alternative of an operation of such a semiconductor circuit in which problems with parasitic diodes may arise.

An example that frequently occurs in practical application is a CMOS circuit having a p⁻-substrate in which the n⁺-source and drain regions of an N-channel MOS transistor are formed, and an n⁻-well region in which the p⁺-drain and source regions of a P-channel MOS transistor and an n⁺-type well contacting region are located. Such a semiconductor structure is shown in fragmentary and schematic manner in FIGS. 1 to 3. In these figures, the well region is designated W, the well contacting region is designated WK, the drain regions are designated D and the source regions are designated S. The semiconductor junctions between drain and source regions constitute, together with the material in which they are embedded, semiconductor diodes which may be blocking or conducting, depending on the bias voltage present across these semiconductor junctions. In FIGS. 1 to 3, such diodes, which hereinafter are referred to as parasitic diodes, are shown in broken lines for the P-channel MOS transistor located in well region W. The drain well diode thereof is designated DWVD, and the source well diode SWD.

There are circuit arrangements, for example driver circuits for liquid crystal display devices (LCD) to which is supplied on the one hand a positive supply voltage potential VDD of a supply voltage source and on the other hand a positive LCD operating voltage VLCD. While the supply voltage potential VDD generally has a constant potential value, the LCD operating voltage VLCD is mostly variable, for example for being able to adjust a desired contrast or for temperature tracking, through which the effects of temperature fluctuations are compensated. The variability of VLCD in relation to VDD may have the result that VLCD at one moment of time is greater than VDD and at a different moment of time is smaller than VDD.

In practical application, the two possibilities shown in FIGS. 2 and 3 exist, namely to apply VDD to the source region S of the P-channel MOS transistor located in well region W and to apply VLCD to the well contacting region WK FIG. 2), or vice versa to apply VLCD to the source region of this P-channel MOS transistor and VDD to the well contacting region WK (FIG. 3).

The two parasitic diodes DWD and SWD normally should be blocked in order to avoid transverse and leakage currents that may lead to falsification of the electrical behavior of the integrated semiconductor circuit, possibly to such an extent that this semiconductor circuit no longer fulfills the prescribed specification.

For keeping the parasitic diode SWD in the blocked state or off-state, the condition VDD≦VLCD must be fulfilled in case of FIG. 2, whereas in case of FIG. 3 the condition VLCD≦VDD must be fulfilled. This means that none of the two alternatives depicted in FIGS. 2 and 3 permits that the values of the two potentials VDD and VLCD are made independent of each other.

Figure 4:
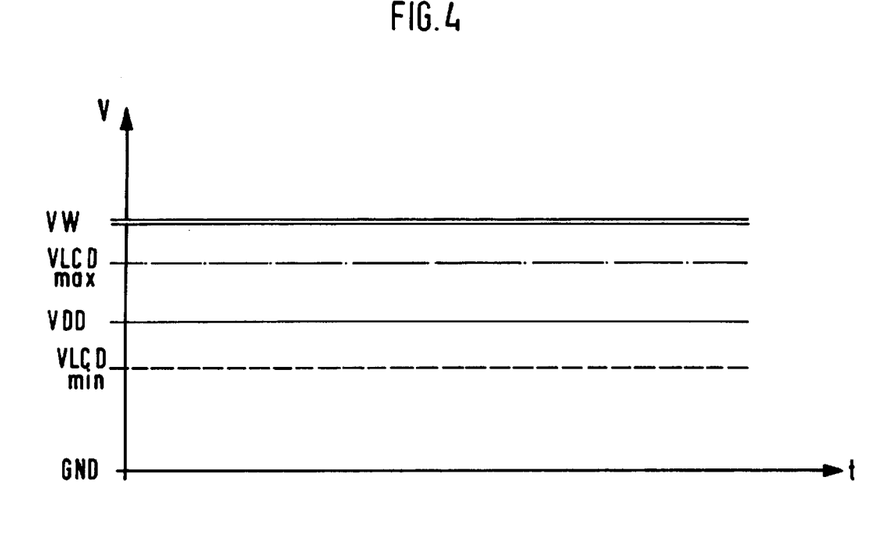
FIG. 4 depicts voltage values that may occur with the semiconductor circuits of FIGS. 1 to 3.

FIG. 4 shows an example of voltage patterns of VDD and VLCD. It is assumed in this respect that VLCD, when the value thereof is to be variable in the manner desired, is between a minimum value VLCDmin and a maximum value VLCDmax, whereas VDD has a constant potential between these values. However, this desired alteration range of VLCD can be realized neither in case of FIG. 2 nor in case of FIG. 3, when it is to be ensured that the parasitic diode SWD remains blocked. In case of FIG. 2, only the range between VDD and VLCDmax can be utilized for VLCD, whereas in case of FIG. 3 only the range between VLCDmin and VDD can be utilized for VLCD.

Corresponding considerations can be made for a semiconductor circuit in which substrate or epitaxial layer, well region W, well contacting region WK, drain region D and source region S are of conductivity types that are opposite to the conductivity types shown in FIGS. 1 to 3. Such a semiconductor circuit usually is operated with negative supply or operating voltages which, just as with the examples elucidated by way of FIGS. 2 and 3, cannot be independent of each other when it is to be ensured that the parasitic diode SWD remains blocked.

As regards parasitic diodes DWD, similar considerations are applicable as for parasitic diodes SWD. Due to the fact that the amount of the potential VD present at drain region D, because of the voltage drop across the channel distance, usually is lower than the value of the potential present at the source region, when the parasitic diode DWD remains blocked, then such conditions are observed for VDD and VLCD that parasitic diode SWD remains blocked too.

It is known from U.S. Pat. No. 5,444,397 with respect to a semiconductor structure in which a P-channel MOS transistor is formed in a well region and one of two different potentials of the same sign may be applied in alternative manner to the drain region, with said potentials having different values, to apply to the well contacting region a potential having the same sign as the two potentials that may be applied to the drain region in alternative manner, and having a value that is as large as the maximum value which may be assumed by the two potentials that may be alternatively applied to the drain region.

In case of the example elucidated by way of FIGS. 2 and 3, in which a supply voltage potential VDD or an LCD operating potential VLCD, with voltage values and ranges according to FIG. 4, can be applied in alternative manner to the source region of a P-channel MOS transistor located in a well region, the application of the teaching according to U.S. Pat. No. 5,444,397 has the result that a potential is applied to the well contacting region which on the one hand is positive and the potential value of which on the other hand is equal to or greater than VDD or VLCDmax, depending on whether the value of VDD or the value of VLCDmax is greater.

The two potentials which alternatively are applicable, for example, to the source region of a MOS transistor formed in a well region, may be selected in completely independent manner with respect to each other and may be made variable relative to each other as desired, without causing an undesired conduction of the parasitic diodes. Care merely has to be taken that the potential applied to the well contacting region has a value which is equal to or greater than the value that may be assumed at maximum by the two potentials alternatively applicable to the source region.

SUMMARY OF THE INVENTION

According to an embodiment of the present invention a circuit is provided which, for different modes of operation, may be driven selectively to an input stage mode or an output stage mode, in which different potentials may reach the source or drain regions of MOS transistors formed in at least one well region, without problems of the type mentioned arising.

According to another embodiment of the present invention, there is provided a monolithic integrated multiple-mode circuit having an output stage, a transfer gate, a control circuit arrangement that can be programmed either into an output stage mode or into an input stage mode, and a well contacting region where a well potential may be applied.

BRIEF DESCRIPTION OF THE DRAWINGS

The invention will now be elucidated in more detail by way of an embodiment with reference to the drawings wherein.

DETAILED DESCRIPTION OF THE INVENTION

FIG. 1 illustrates a monolithic integrated semiconductor circuit with the structure that has already been elucidated by way of FIGS. 2 and 3, but with a voltage application of the well contacting region WK with a well voltage VW which, as shown in FIG. 4, has a value above the potential value of VLCDmax. It is ensured in this manner that the two parasitic diodes SWD and DWD always remain blocked, irrespective of whether VDD or VLCD is applied to the source regions and to what extent VDD and VLCD change in relation to each other.

Figure 5:
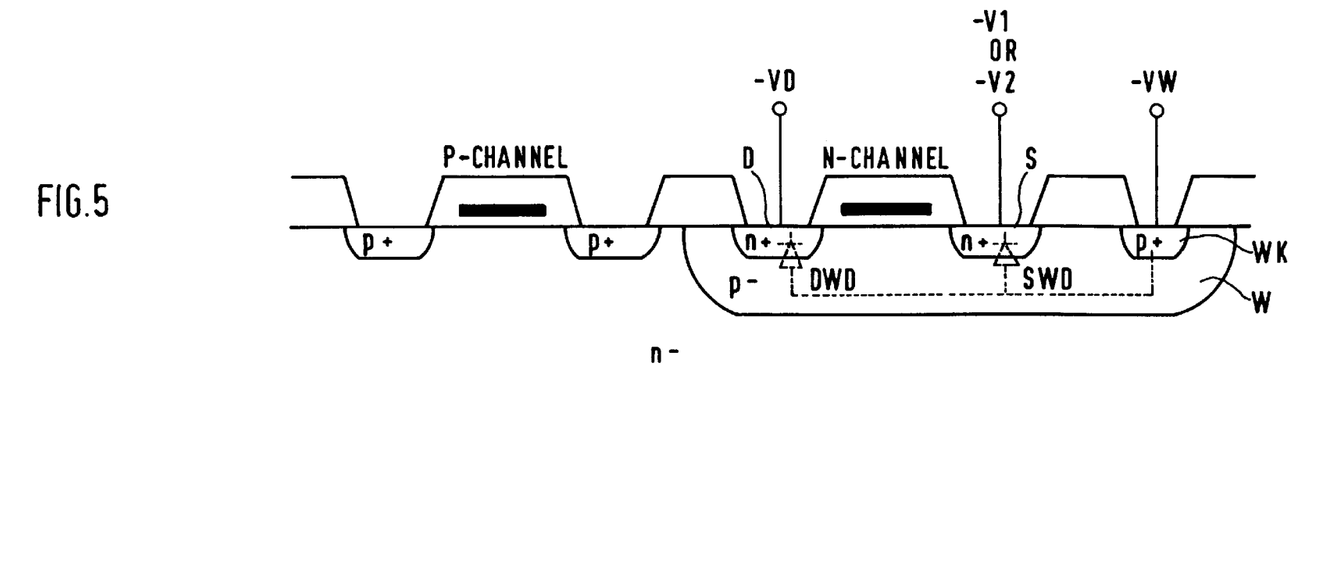
FIG. 5 shows a second embodiment of a monolithic integrated semiconductor circuit involving a voltage mode that avoids problems with parasitic diodes.

FIG. 5, with respect to the conductivity type, shows the counterpart to the semiconductor structure depicted in FIG. 1. This means that the conductivity types of the individual layers and zones, the channel types of the two MOS transistors, and the signs of the potentials are opposite to the embodiment shown in FIG. 1. For keeping the two parasitic diodes DWD and SWD blocked, a well potential −VW is applied to well contacting region WK. The absolute value of −VW is higher than the maximum absolute value of the two potentials −V1 and −V2, which may be applied alternatively to the source region.

Figure 6:
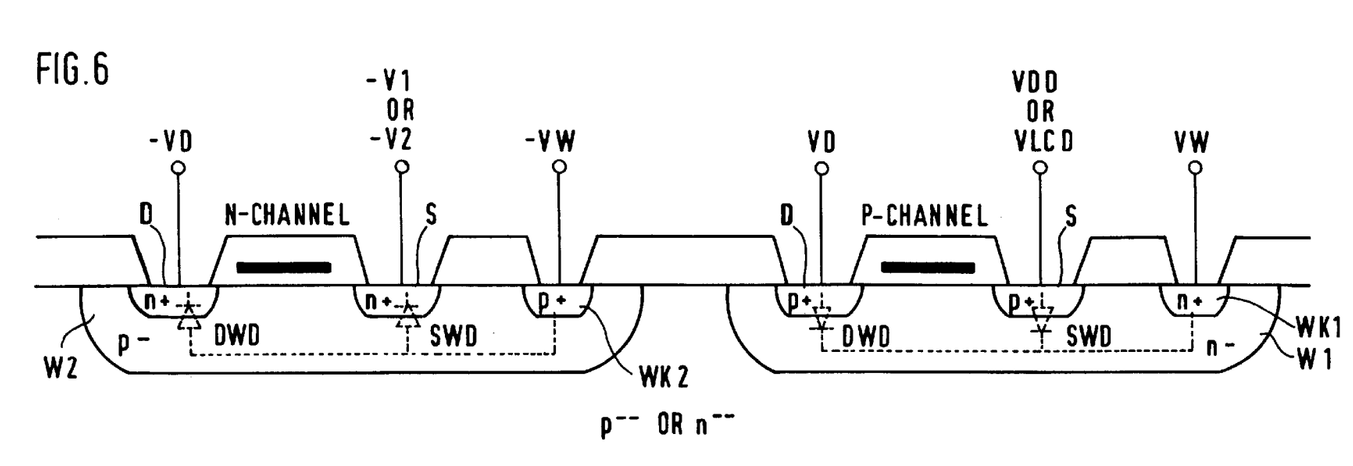
FIG. 6 shows a third embodiment of a monolithic integrated semiconductor circuit in the form of a double well circuit, involving a voltage mode that avoids problems with parasitic diodes.

FIG. 6 shows a semiconductor circuit having a double well structure. Introduced into a substrate of relatively low p- or n-conductivity are an n-type well region W1 and a p-type well region W2, in which are formed a P-channel MOS transistor and a well contacting region WK1 in accordance with the structure shown in FIG. 1, or an N-channel MOS transistor and a well contacting zone WK2 in accordance with the structure shown in FIG. 5, respectively. The well contacting zones WK1 and WK2 have potentials applied thereto satisfying the conditions elucidated in conjunction with FIG. 1 for VW and the conditions elucidated in conjunction with FIG. 5 for −VW, respectively.

Figure 7:
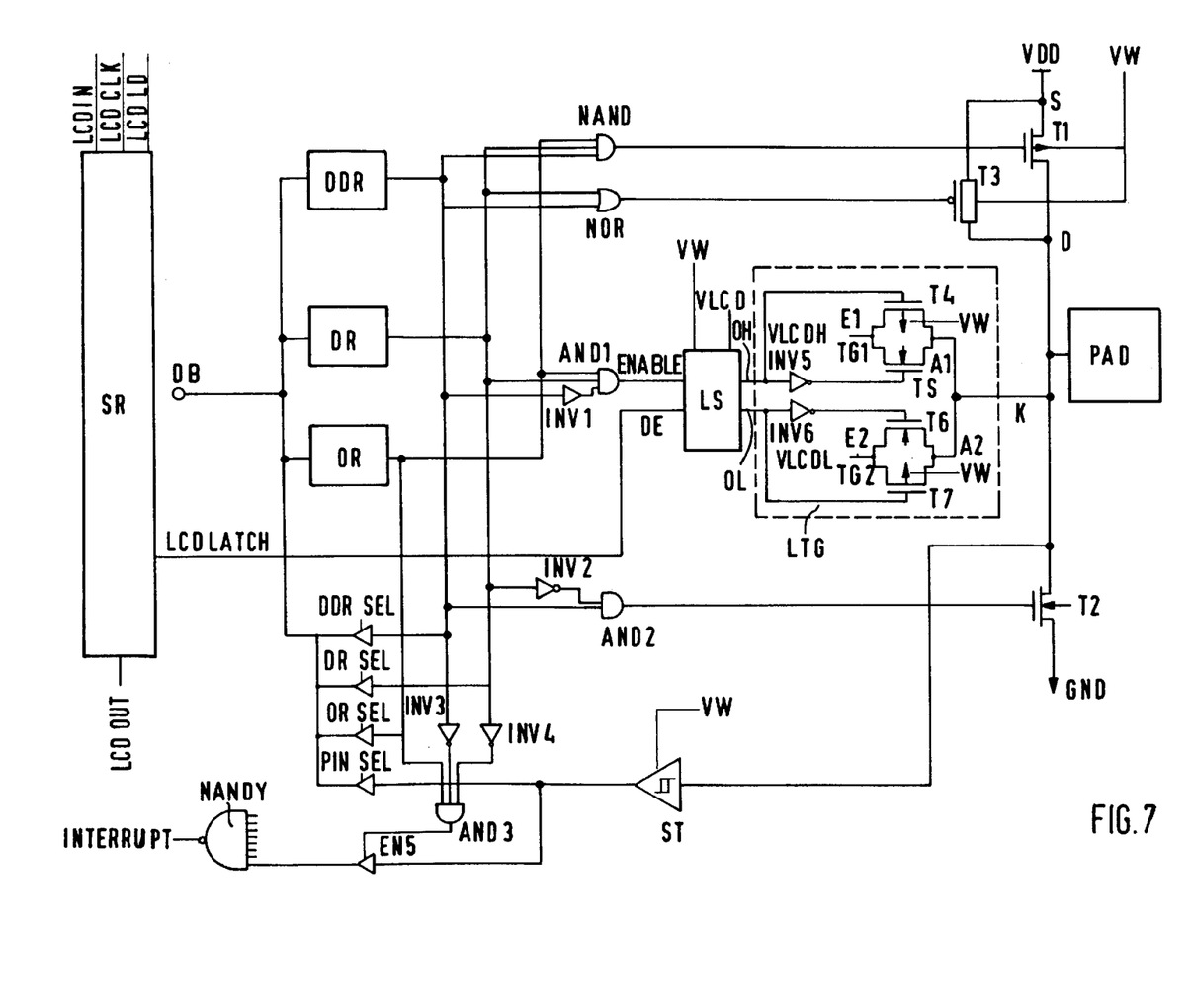
FIG. 7 shows an embodiment of a multiple mode circuit according to the invention.

FIG. 7 shows an example of a monolithic integrated multiple mode circuit according to an embodiment of the invention, which is operated in such a manner that the problems outlined with respect to parasitic diodes do not occur. This multiple mode circuit on the one hand has a positive supply voltage potential VDD applied thereto and on the other hand has a liquid crystal display operating voltage potential VLCD applied thereto, with these two potentials having for example the mutually variable relationship shown in FIG. 4. This multiple mode circuit comprises a series of P-channel MOS transistors which are each formed in a well structure according to FIG. 1 and whose source regions either have VDD or VLCD applied thereto. These P-channel transistors are in part shown and in part are contained in more complex circuit blocks without being depicted themselves. The well contacting regions of all such P-channel transistors which are in electrical connection, or can be brought into electrical connection, with a contacting area PAD serving for connection to external circuit components, have a well potential VW applied thereto corresponding to the conditions according to the embodiment of the invention, as shown for example in FIG. 4, with respect to its relationship to VDD and VLCD. It is ensured thereby that, irrespective of whether VDD or VLCD is applied to the source terminal of such a P-channel MOS transistor and irrespective of whether VLCD is permanently or temporarily smaller or greater than VDD, the parasitic diodes DWD and SWD thereof always remain blocked.

The multiple mode circuit shown in FIG. 7 is a circuit which can be operated selectively either as an output stage or as an input stage of a circuit arrangement. In case of operation thereof as an output stage, it may be operated, for example, as: driver circuit for a liquid crystal display device; LED driving circuit; or driving circuit for a load, for example in the form of an electrical resistor or a relay.

In the mode as input circuit: data information can be received and transferred further to a data bus; or the instantaneous electrical condition of a circuit component can be detected which is connected to the contacting area PAD and is capable of changing its electrical state.

The particular operating mode assumed by the circuit shown in FIG. 7 is dependent upon data that are each input in a register means having registers DDR, DR and OR. DDR is a data flow direction register for storing control data determining the data flow direction in the multiple mode circuit. DR designates a data register for temporary storage of data to be transferred. OR is an option register for storing operational mode data for selecting the possible modes of operation. Inputs of DDR, DR and OR are connected to a data bus DB through which they are fed with their data. Outputs of DDR, DR and OR are connected to a logic circuit arrangement containing a NAND logic circuit NAND, a NOR logic circuit NOR, first AND logic circuit AND 1, a second AND logic circuit AND2, and a third AND logic circuit AND3. Logic circuit NAND has three inputs, a first one thereof being coupled to the output of DDR, a second one to the output of DR and a third one to the output of OR. Logic circuit NOR has two inputs, one thereof being coupled to the output of DDR and the other one thereof being coupled to the output of DR. Logic circuit AND1 has three inputs, one thereof being coupled via a first inverter INV1 to the output of DDR, a second one thereof being coupled to the output of DR, and a third one thereof being coupled to the output of OR. Logic circuit AND2 has two inputs, one thereof being coupled to the output of DDR and the other one being coupled via a second inverter INV2 to the output of DR. Logic circuit AND3 has three inputs, with a first one thereof being coupled to the output of OR, a second one thereof being coupled via a third inverter INV3 to the output of DDR and a third one thereof being coupled via a fourth inverter INV4 to the output of DR.

The multiple mode circuit of FIG. 7 comprises a CMOS output stage having a P-channel MOS transistor T1 on the high potential side, which is connected to VDD, and an N-channel MOS transistor T2 on the low potential side, which is connected to a ground terminal GND. In a circuit node K, the series connected transistors T1 and T2 are connected to each other and to connecting area PAD. The gate of T1 is connected to the output of logic circuit NAND, while the gate of T2 is connected to the output of logic circuit AND2.

Transistor T1 is bridged by a resistor-MOS transistor T3 having its gate connected to the output of logic circuit NOR presenting resistance, and serving as a switchable resistor representing in the conducting state a defined ohmic resistance, of for example about 100 KΩ, and in the non-conducting state a virtually infinite resistance, as is usual for MOS transistors.

Between the output of logic circuit AND1 and circuit node K, there is connected a series connection including a level shifter LS and an LCD transfer gate LTG. Level shifter LS has two inputs, namely an ENABLE input connected to the output of AND1 and a data input DE coupled to an output LCD LATCH of a conventional LCD shift register SR. Level shifter LS has two outputs OH and OL coupled to an upper and a lower one, respectively, of two parallel circuit branches of LCD transfer gate LTG. The upper one of these two circuit branches comprises a parallel connection of a fifth inverter INV5 and a first transistor gate TG1. The lower circuit branch comprises a parallel connection of a sixth inverter INV6 and a second transistor gate TG2. First transistor gate TG1 consists of a parallel connection of a P-channel MOS transistor T4 and an N-channel MOS transistor T5, while second transistor gate TG2 consists of a parallel connection of an N-channel MOS transistor T6 and a P-channel MOS transistor T7. The gates of T4 and T5 are coupled directly and via INV5, respectively, to the output OH of level shifter LS. The gates of T6 and T7 are coupled via INV6 and directly, respectively, to the output OL of LS. An input E1 of first transfer gate TG1 is fed with a voltage VLCDH, and an input E2 of second transfer gate TG2 is fed with a voltage VLCDL. Outputs A1 and A2, respectively, of TG1 and TG2 are connected in common to circuit node K and thus to contacting area PAD.

In the mode of operation in which the circuit shown in FIG. 7 serves as an LCD driver circuit, PAD has connected thereto an LCD pixel of an LCD display device composed with display pixels (for example dot-shaped display elements arranged in matrix fashion). The information whether the LCD pixel connected to PAD is to be brought into a displaying state or a non-displaying state, is derived from the output LCD LATCH of LCD shift register SR. To this end, display information relating to the specific pixel connected to PAD is shifted into shift register SR via a display information input LCD IN of LCD shift register SR.

For each pixel of the entire LCD display device, there is provided a circuit according to FIG. 7. The entire driver circuit for such an LCD display device thus contains also a multiplicity of shift registers SR that are each connected to each other via a signal input LCD IN and a signal output LCD OUT. The overall display of the LCD display device is prepared in that the display information corresponding to the individual pixels is shifted, stating from a first shift register, through the individual shift registers until the display information relating to a first pixel has arrived in the last shift register in charge of this first pixel. Shifting of the display information through the shift registers takes place with the aid of a shift clock supplied to a clocking input LCD CLK of each of these shift registers SR. When the display information has been shifted through the shift register series connection to such an extent that display information of each pixel is present in associated shift register SR, each of these shift registers SR is fed via a further input LCD LD with corresponding charging state information. Thereafter, shift register SR serves as a latch memory for associated pixel display information which then is fed from output LCD LATCH to the contacting area PAD of the associated driver circuit via level shifter LS and LCD transfer gate LTG, and from there is fed to the associated pixel display element.

Figure 8:
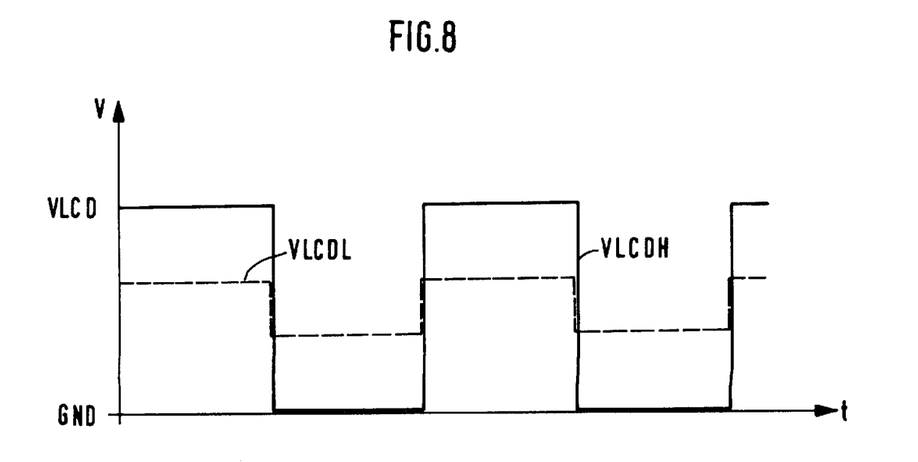
FIG. 8 shows two voltage patterns that may arise with the multiple mode circuit shown in FIG. 7.

FIG. 8 shows the voltage patterns VLCDH and VLCDL fed to inputs E1 and E2 of TG1 and TG2, respectively, in continuous line and in broken line, respectively. A voltage curve of VLCDH activates the associated pixel, i.e., brings the same to a displaying state. The voltage curve VLCDL renders the associated pixel inactive, i.e., keeps the same in the non-displaying state. When level shifter LS has been enabled by AND via its input ENABLE, level shifter LS, in accordance with the display information fed to its data input DE from shift register SR, issues a transfer gate opening signal either via its output OH to first transfer gate TG1 or via its output OL to second transfer gate TG2. In accordance therewith, either T4 and T5 or T6 and T7 are switched into the conducting state so that either voltage curve VLCDH or voltage curve VLCDL reaches the associated LCD pixel via contacting area PAD.

In addition thereto, the multiple mode circuit shown in FIG. 7 comprises a transfer path for the input stage mode. This transfer path includes a Schmitt-trigger ST having its input coupled to PAD and having its output coupled on the one hand via a switchable amplifier PIN SEL to data bus DB and on the other hand via a switched buffer EN5 to an input of a multi-NAND circuit NANDV. The further inputs of NANDV are connected to switched buffers of other multiple mode circuits arranged parallel thereto. An INTERRUPT signal can be issued via the output of NANDV.

Switched amplifiers DDR SEL, DR SEL or OR SEL, in the output stage mode of the multiple mode circuit, serve the function that the data information contained in registers DDR, DR and OR can be returned to data bus DB.

In the following, further modes of operation will be elucidated which can also be assumed by the multiple mode circuit shown in FIG. 7.

Whether this circuit is in the input stage or in the output stage mode and which specific mode of operation in the input and output stage mode, respectively, is dependent on the data values input in registers DDR, DR and OR.

At first, modes of operation shall be considered in which this circuit serves as an output stage.

If it is to be used as an LCD pixel driver, the following logic values are input in the registers of the register means:
DDR=0
DR=1
OR=1

The ENABLE input of level shifter LS is fed with logic value 1 so that LS is enabled.

Due to the logic values in DDR, DR and OR, transistors T1, T2 and T3 are switched off. Due to enabling of LS, it is possible in accordance with the display information present in shift register SR to issue, via PAD, either the voltage pattern VLCDH activating the pixel display or the voltage pattern VLSDL not resulting in pixel display.

If the multiple mode circuit is to be used for driving an LED (light emitting diode), the following logic values are input into the registers of the register means:
DDR=1
DR=0 or 1 (depending on whether or not the LED is to light up)
OR=1.

This has the effect that transistors T1 and T2 are alternatively switchable on in push-pull operation, whereas T3 is permanently switched off.

For the mode of the so-called open-drain-control, in which T1 is permanently switched off, so that the drain potential thereof present at PAD is floating when T2 is switched to the off-state, the potential of PAD is defined by a load connected to PAD, for example in the form of a resistor or a relay. For this mode of operation, the following logic values are entered into the register means:
DDR=1
DR=1 or 0
OR=0.

Due to these logic values, T1 and T3 are permanently off. Whether T2 is in the off-state or in the conducting state, is dependent upon whether the logic value in DR is 1 or 0. When T2 is conducting, the potential of contacting area PAD is at ground potential GND. In case T2 is in the off-state, the potential of PAD in undefined manner is somewhere between VDD and GND, and thus has an undefined, floating potential. In this case, the potential of PAD is determined exclusively by the external load connected to PAD.

In the following, additional modes of operation will be considered in which the multiple mode circuit of FIG. 7 operates in the input stage mode.

In a first mode of operation, the contacting area PAD is connected to an external signal source, from which data signals are supplied to PAD from the outside. In this case, transistors T1, T2 and T3 are at all times in the off-state. In addition thereto, level shifter LS is in the off-state in that it is not enabled via the input ENABLE.

This mode of operation is achieved for example in that logic value 0 is input in one of the two registers DDR and DR, and logic value 1 is input in the other one of these two registers. In this manner, the sole transfer path left open is that leading from contacting area PAD via Schmitt-trigger ST and amplifier PIN SEL to data bus DB.

Finally, the input stage mode of operation will be described in which transistors T1 and T2 as well as level shifter LS are in the off-state and only resistor-MOS transistor T3 is switched to the conducting state. To this end, logic value 0 is input in each of the two registers DDR and DR. The effect achieved thereby is that a defined potential adjusts at contacting area PAD, which is dependent upon the voltage drop across T3. In such a mode of operation, this multiple mode circuit is suitable, for example, for detecting the switch position of an external mechanical switch connected to PAD. In case the switch is closed, a transverse current flows across T3.

As was already mentioned, this multiple mode circuit comprises a series of P-channel MOS transistors situated in an $n^-$-well region, as shown in FIGS. 1 to 3. For avoiding the problems mentioned with respect to parasitic diodes, the contacting regions of such P-channel MOS transistors have a well potential VW applied thereto which is at least as high as the amount which may be assumed at maximum by the two potentials VDD and VLCD. FIG. 7 illustrates which P-channel transistors of the multiple mode circuit and which circuit blocks containing P-channel MOS transistors that are not shown in FIG. 7, have the well voltage VW applied thereto.

In the multiple mode circuit shown in FIG. 7, the well contacting regions of at least those P-channel MOS transistors which are electrically connected to contacting area PAD or may be electrically connected thereto, are connected to the well potential VW.

To supply the well potential VW to the well contacting regions of such P-channel transistors has a further advantage in addition to ensuring that parasitic diodes are blocked. For example, when considering the P-channel transistor T1, the well contacting region thereof, in the conventional mode of operation, would have the supply voltage potential VDD. If a potential VPAD>VDD were present then at contacting area PAD, and thus at the drain region of T1, the parasitic diode DWD of T1 would be conducting. Due to the fact that the well contacting region of T1 has the well potential VW applied thereto, which may have a considerably higher value then VDD, potentials may appear at the drain of T1 that may be considerably higher than VDD. As the amount of the well potential VW may be as high as the voltage compatibility limit that is dependent only on the specific semiconductor technology used, the admissible potential of PAD may be considerably higher than the usual potential value of VDD.

For example, if an external relay is controlled via PAD, it may be of great advantage that this does not have to be operated with the voltage value of VDD, but with the possibly much higher voltage value of VW.

When the circuit shown in FIG. 7 is used e.g., in the field of motor vehicle electronics, battery voltages of 12 V are available. This is considerably more than the conventional supply voltage VDD of, for example, 4.5 V to 5 V. When 12 V is employed as well potential VW, it is thus possible to allow at PAD a potential of up to 12 V without the parasitic diodes of T1 conducting.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An integrated circuit formed on a die having a substrate of a first conductivity type, the integrated circuit comprising:

first and second supply terminals operatively coupled to receive first and second supply voltages having first and second absolute values, respectively;

a configurable terminal;

a well region of a second conductivity type formed in the substrate, the well region operatively coupled to a well voltage having an absolute value that is greater than the absolute values of the first and second supply voltages;

a transfer gate that includes a first field-effect transfer transistor of a first type formed in the well, the first transfer transistor having a first source/drain region operatively coupled to receive a driving voltage, a second source/drain region coupled to the configurable terminal, and a gate electrode, the driving voltage having a maximum absolute value that is less than the absolute value of the well voltage;

a first field-effect output transistor of the first type formed in the well region and having a first source/drain region coupled to the first supply terminal, a second source/drain region coupled to the configurable terminal, and a gate electrode;

a second field-effect output transistor of a second type formed in a region of the substrate that is outside of the well region, the second output transistor having a first source/drain region coupled to the second supply terminal, a second source/drain region coupled to the configurable terminal, and a gate electrode;

an input buffer having an input terminal coupled to the configurable terminal and having an output terminal, the buffer including a field-effect transistor of the first type formed in the well region; and a control circuit coupled to the gate electrodes of the first transfer transistor and the first and second output transistors, the control circuit operable to configure the configurable terminal as a driving terminal by enabling the transfer transistor and disabling the first and second output transistors, the control circuit operable to configure the configurable terminal as a push-pull output terminal by disabling the transfer transistor and enabling the first and second output transistors, the control circuit operable to configure the configurable terminal as an input terminal by disabling the transfer transistor and the first and second output transistors such that the configurable terminal is operable to receive an input voltage having an absolute value that is no greater than the absolute value of the well voltage.

2. The integrated circuit according to claim 1, further comprising a switchable resistance coupled between the first supply terminal and the configurable terminal, the switchable resistance being switchable by the control circuit.

3. The integrated circuit according to claim 1, further comprising a switchable resistive field-effect transistor having a first source/drain region coupled to the first supply terminal, a second source/drain region coupled to the configurable terminal, and a control terminal coupled to the control circuit, the switchable resistive field-effect transistor being switchable by the control circuit.

4. The integrated circuit according to claim 1 wherein the transfer gate further comprises a second field-effect transfer transistor of the second type, the second transfer transistor having a first source/drain region operatively coupled to receive the driving voltage, a second source/drain region coupled to the configurable terminal, and a gate electrode coupled to the control circuit.

5. The integrated circuit according to claim 1 wherein the first field-effect transfer transistor, the first field-effect output transistor, and the field-effect transistor of the input buffer comprise PMOS transistors, and the second field-effect output transistor comprises a NMOS transistor.

6. The integrated circuit according to claim 1 wherein the well voltage is supplied from a source that is external to the integrated circuit.

7. The integrated circuit according to claim 1, further comprising:

a second well region of the first conductivity type formed in the substrate; and wherein the second field-effect output transistor is formed in the second well region.

8. A method for configuring a configurable terminal, the method comprising:

supplying a well voltage to a well region of a substrate, the well voltage having an absolute value that is greater than the absolute values of first and second supply voltages;

supplying a driving voltage to a field-effect transfer transistor of a first type that is formed in the well region, the driving voltage having a maximum absolute value that is less than the absolute value of the well voltage;

enabling the transfer transistor and disabling first and second output transistors to configure the configurable terminal as a driving output terminal, the first output transistor being of the first type, being formed in the well region, and being coupled to the first supply voltage; and disabling the transfer transistor and the first and second output transistors to configure the configurable terminal as an input terminal that can receive a voltage having a maximum absolute value that is less than or equal to the absolute value of the well voltage.

9. The method according to claim 8, further comprising disabling the transfer transistor and enabling the first and second output transistors to configure the configurable terminal as a push-pull output terminal.

10. The method according to claim 8, further comprising disabling the transfer transistor, disabling the first and second output transistors, and enabling a switchable resistance to configure the configurable terminal as resistively loaded input terminal, the switchable resistance being coupled between the first supply voltage and the configurable terminal.

11. The method according to claim 8 wherein the well voltage is supplied from an external source.

12. A monolithic integrated multiple-mode circuit, comprising:

a. a first CMOS output stage having a low potential side first MOS transistor of a first channel type, a high potential side first MOS transistor of a second channel type, and a contacting area disposed between these two transistors, and connected to these two transistors for an electric input or output connection with external circuit elements;

b. a resistor-MOS transistor connected in parallel to the first MOS transistor of the second channel type, said transistor serving as a switchable resistor and being drivable to an off-state or to an on-state in which this transistor constitutes a defined forward resistance;

c. a transfer gate having at least a second MOS transistor of the second channel type and being drivable to a transfer state in which the transfer gate transfers load driver signals from a driver signal source to the contacting area;

d. a transfer path having at least a third MOS transistor of the second channel type and being operable for a transfer of signals entering via the contacting area to a signal exploitation circuit and/or a data bus of the multiple-mode circuit; and e. a control circuit arrangement to which control signals can be supplied and which drives the multiple-mode circuit in accordance with the control signals either into an output stage mode, in which the multiple-mode circuit provides driver signals to a load connected to the contacting area, or into an input stage mode, in which the multiple-mode circuit receives input signals from a signal source connected to the contacting area;

in which said control circuit arrangement e.1 in the output stage mode renders the two transistors of the CMOS output stage and the resistor-MOS transistor non-conducting and the transfer gate conducting, or renders the resistor-MOS-transistor and the transfer gate non-conducting and the two transistors of the CMOS output stage in push-pull operation conducting, or renders the high potential side transistor of the CMOS output stage, the resistor-MOS transistor and the transfer gate non-conducting and the low potential side transistor of the CMOS output stage conducting; and e.2 wherein said control circuit arrangement in the input stage mode either renders the two transistors of the CMOS output stage, the resistor MOS transistor and the transfer gate non-conducting while the master path is conducting, or renders the two transistors of the CMOS output stage and the transfer gate non-conducting and the resistor-MOS transistor conducting;

f. with the possibility of different potentials of the same predetermined sign, but different, possibly variable amount being present at the contacting area;

g. with said transistors of the second channel type being disposed in at least one well region having a well contacting region;

h. and with the possibility that the well contacting region of each transistor of the second channel type, which is or may be connected to the contacting area, has a well potential applied thereto which has the predetermined sign and whose amount is at least as great as the maximum amount which the potential at the contacting pad can assume at maximum.

13. The multiple-mode circuit of claim 12 wherein the transistors of the first channel type are N-channel MOS transistors and the transistors of the second channel type are P-channel MOS transistors, and wherein the predetermined sign is positive.

14. The multiple-mode circuit of claim 12 wherein the control circuit arrangement comprises:

a register means having a data flow direction register for storing control data determining the data flow direction of the multiple-mode circuit, a data register for temporarily storing data signals to be transferred, and an option register for storing mode data selecting the possible modes; and a logic circuit arrangement connected between the register means on the one hand and the CMOS output state, the resistor-MOS transistor and the transfer gate on the other hand and effecting the control thereof.

* * * * *